(12) United States Patent (10) Patent No.: US 10,679,948 B2
Ogawa et al. (45) Date of Patent: Jun. 9, 2020

(54) SEMICONDUCTOR DEVICE AND METHOD FOR MANUFACTURING SAME

(71) Applicant: TOWERJAZZ PANASONIC SEMICONDUCTOR CO., LTD., Uozu, Toyama (JP)

(72) Inventors: Takahisa Ogawa, Toyama (JP); Mitsunori Fukura, Kyoto (JP); Nobuyoshi Takahashi, Toyama (JP)

(73) Assignee: TowerJazz Panasonic Semiconductor Co., Ltd., Uozu, Toyama (JP)

( * ) Notice: Subject to any disclaimer, the term of this patent is extended or adjusted under 35 U.S.C. 154(b) by 11 days.

(21) Appl. No.: 16/194,553

(22) Filed: Nov. 19, 2018

(65) Prior Publication Data
US 2019/0088602 A1 Mar. 21, 2019

Related U.S. Application Data

(63) Continuation of application No. PCT/JP2017/016834, filed on Apr. 27, 2017.

(30) Foreign Application Priority Data

May 18, 2016 (JP) .................................. 2016-099218

(51) Int. Cl.
*H01L 23/52* (2006.01)
*H01L 23/544* (2006.01)
(Continued)

(52) U.S. Cl.
CPC .............. *H01L 23/544* (2013.01); *G03F 1/42* (2013.01); *G03F 7/70466* (2013.01);
(Continued)

(58) Field of Classification Search
CPC ............... H01L 21/0337; H01L 23/544; H01L 2223/54426; G03F 7/70633; G03F 1/42
See application file for complete search history.

(56) References Cited

U.S. PATENT DOCUMENTS 6,003,223 A * 12/1999 Hagen ................. G03F 7/70433
29/603.12
6,204,912 B1 3/2001 Tsuchiya
(Continued)

FOREIGN PATENT DOCUMENTS

JP 2000199973 A 7/2000
JP 2002229215 8/2002
(Continued)

OTHER PUBLICATIONS

International Search Report for corresponding application PCT/JP2017/016834 filed Apr. 27, 2017; dated Jul. 25, 2017.

*Primary Examiner* — Luan C Thai
(74) *Attorney, Agent, or Firm* — Knobbe, Martens, Olson & Bear, LLP

(57) ABSTRACT

A semiconductor device includes first and second inspection mark regions having the same pattern including a plurality of overlay inspection marks, a first element region having a portion overlapping with the first inspection mark region, and a second element region having a portion overlapping with the second inspection mark region. The first and second element regions are adjacent to each other and have different areas. The first element region includes a first pattern aligned with a plurality of first overlay inspection marks. The second element region includes a second pattern aligned with a plurality of second overlay inspection marks.

18 Claims, 16 Drawing Sheets

(51) Int. Cl.
*G03F 1/42* (2012.01)
*G03F 9/00* (2006.01)
*G03F 7/20* (2006.01)
*H01L 21/033* (2006.01)

(52) U.S. Cl.
CPC ...... *G03F 7/70475* (2013.01); *G03F 7/70633* (2013.01); *G03F 9/7076* (2013.01); *G03F 9/7084* (2013.01); *H01L 21/0337* (2013.01); *H01L 2223/54426* (2013.01)

(56) References Cited

U.S. PATENT DOCUMENTS

| 6,213,607 B1 * | 4/2001 | Watanabe ........... G03F 7/70066 |
| | | 355/53 |
| 9,128,388 B2 * | 9/2015 | Komine ................ G03F 9/7026 |
| 2007/0134564 A1 | 6/2007 | Maejima |
| 2011/0074049 A1 | 3/2011 | Maejima |

FOREIGN PATENT DOCUMENTS

| JP | 2007142328 A | 6/2007 |
| JP | 5062992 B2 | 8/2012 |

* cited by examiner

SEMICONDUCTOR DEVICE AND METHOD FOR MANUFACTURING SAME

CROSS-REFERENCE TO RELATED APPLICATION

This is a continuation of International Application No. PCT/JP2017/016834 filed on Apr. 27, 2017, which claims priority to Japanese Patent Application No. 2016-099218 filed on May 18, 2016. The entire disclosures of these applications are incorporated by reference herein.

BACKGROUND

In recent years, with improvement in function and performance of semiconductor devices, patterns have been reduced in size to integrate as many semiconductor elements as possible. However, the degree to which the number of semiconductor elements to be mounted on a semiconductor substrate increases is much higher than the degree to which patterns are reduced in size. Thus, there has been a need for increasing the area of such a semiconductor substrate. For example, as the performance of an imaging apparatus increases, the size of an imaging element increases. Thus, there has been a need for semiconductor devices with a large frame size called 35 mm full frame.

In general, photolithography is used for manufacturing semiconductor devices. The photolithography is a technology for obtaining a desired pattern by applying a resist on a semiconductor substrate, exposing the resist through a mask having a pattern using an exposure machine, and then developing the resist. However, the pattern of an element required for the large semiconductor device as described above may have an area that is larger than the area that can be exposed by the exposure machine. For example, an imaging section of a 35 mm full-frame semiconductor device described above alone has a size of 36 mm×24 mm. Because the size of a peripheral circuit section is also added, the size of the entire semiconductor device will further increase. However, for example, the area that can be exposed by a general exposure machine is about 33 mm×26 mm. Thus, a pattern cannot be formed by a single exposure.

Thus, to form such a large semiconductor device, stitching exposure is used. In the stitching exposure, a semiconductor device is divided into a plurality of regions of exposable size, and the regions are separately exposed and stitched together.

As an example, FIG. 17 illustrates a solid-state imaging device 11 that includes an imaging section 12 and a peripheral circuit section 13, and that is separated by a scribe region 14. The pattern of the solid-state imaging device 11 has an area larger than an area that can be exposed at once. Thus, the pattern is divided, at a dividing position (a stitch 15), into two divided patterns 16a and 16b, which are separately exposed to provide a desired pattern.

In the stitching exposure described above, importance is placed on high stitching accuracy with which the divided patterns 16a and 16b are stitched. When the stitching accuracy is not high enough, a failure such as a circuit disconnection occurs at the stitch 15.

To improve the stitching accuracy, overlay inspection marks, alignment marks, and other marks may be formed using a single mask, and the pattern of a semiconductor element divided into a plurality of regions reflected by respective masks may be exposed while these regions are each aligned with an associated one of these marks (see Japanese Patent No. 5062992 (Patent Document 1)). Such a method can eliminate displacements of a pattern positioned on the mask, and displacements of a mask positioned on the mask stage of the exposure machine, thus improving stitching accuracy.

SUMMARY

When the technology disclosed in Japanese Patent No. 5062992 is used, a single mask is used to form the overlay inspection marks and the alignment marks. Thus, the regions need to have the same area. Consequently, the position of the stitch is fixed, and thus the position of the stitch cannot be flexibly set.

Moreover, even when such a technology is used, it is actually very difficult to completely eliminate displacements at the stitch, and regions of the pattern at the stitch are misaligned with each other to some extent.

For example, imaging elements are regularly arranged at narrow intervals. Thus, if an element is disposed at the stitch, the stitch may become apparent from an acquired image, as a result of the misalignment between regions of the pattern causing variations in the characteristics of the elements.

When the position of the stitch is fixed in the imaging element as described above, it is difficult to prevent the stitch from becoming apparent at a conspicuous position of the acquired image. Thus, the image may cause a viewer to strongly feel something visually strange. For example, FIG. 18 illustrates an example of an image acquired by an imaging device including an imaging section 12 divided into two right and left regions and a stitch located at the center, such as the solid-state imaging device 11 in FIG. 17. When an apparent stitch 25 is present as in an acquired image 21 of FIG. 18, a central conspicuous portion of the image shows a discontinuity, and causes a viewer to strongly feel something visually strange. Thus, the stitch should not be present around the center of the imaging section 12.

Moreover, in addition to the imaging element, some elements may vary by a slight misalignment. Such elements should not be disposed at the stitch, but when the position of the stitch is fixed as described above, a large restriction is imposed on designing the layout of the elements. In other words, when a certain element should be prevented from being disposed at the stitch, elements cannot be efficiently arranged, thereby increasing the size of the semiconductor device.

A description will therefore be given of how to accurately join adjacent patterns and enable flexible positioning of a stitch, in a semiconductor device using stitching exposure and a method for manufacturing the same.

A semiconductor device of the present disclosure includes: a first inspection mark region and a second inspection mark region having a same pattern including a plurality of overlay inspection marks; a first element region having a portion overlapping with the first inspection mark region; and a second element region having a portion overlapping with the second inspection mark region. The first element region and the second element region are adjacent to each other and have different areas. The first element region includes a first pattern aligned with a plurality of first overlay inspection marks that are some of the overlay inspection marks. The second element region includes a second pattern aligned with a plurality of second overlay inspection marks that are some of the overlay inspection marks.

Moreover, to solve the problems described above, a method for manufacturing a semiconductor device according to the present disclosure includes: exposing an inspection mark mask to form a first inspection mark region and a second inspection mark region having a same pattern including a plurality of overlay inspection marks; exposing a first mask to form a first pattern, thereby forming a first element region having a portion overlapping with the first inspection mark region; and exposing a second mask to form a second pattern, thereby forming a second element region having a portion overlapping with the second inspection mark region. The first element region and the second element region are adjacent to each other and have different areas. In the forming of the first element region, the first mask is aligned with a plurality of first overlay inspection marks that are some of the overlay inspection marks. In the forming of the second element region, the second mask is aligned with a plurality of second overlay inspection marks that are some of the overlay inspection marks.

With the semiconductor device of the present disclosure, the first element region and the second element region having two patterns with different areas are aligned with the first inspection mark region and the second inspection mark region having the same pattern. Consequently, the position of a stitch between the first element region and the second element region is not fixed, and thus the position of the stitch can be flexibility set. Hence, the degree to which the layout of elements is limited is reduced, thereby reducing the time and efforts required for design, and/or reducing the size of the semiconductor device. Moreover, when the technology of the present disclosure is applied to an imaging element, it is possible to prevent the stitch from being present around the center of the imaging section. Consequently, it is possible to prevent the stitch from becoming apparent in a conspicuous position around the center of the acquired image.

DETAILED DESCRIPTION

First, stitching exposure according to the present disclosure will be described.

Figure 1:
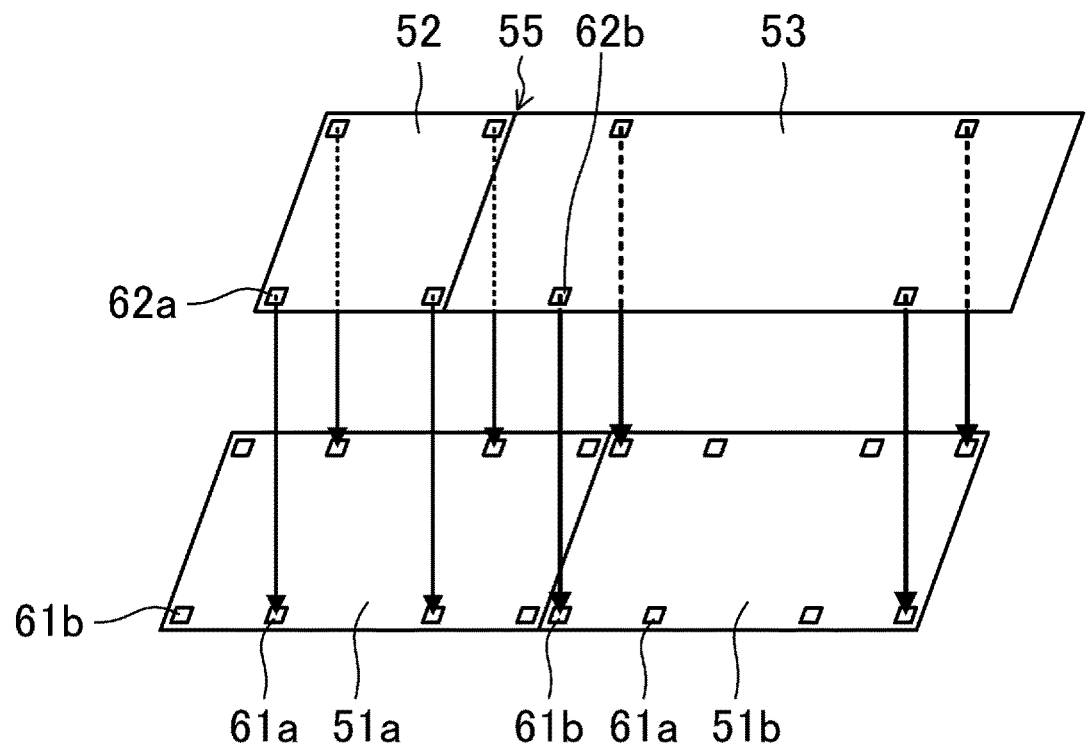
FIG. 1 is a schematic diagram for explaining stitching exposure of the present disclosure.
Figure 2:
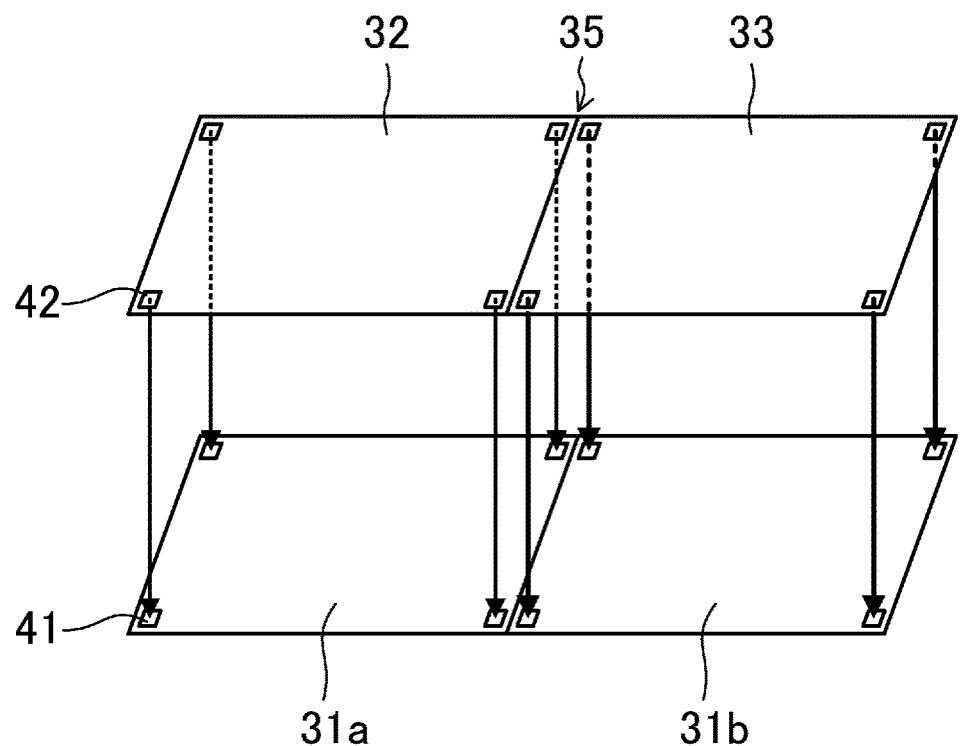
FIG. 2 is a schematic diagram for explaining known stitching exposure.

FIGS. 1 and 2 are diagrams for explaining stitching exposure of the present disclosure and known stitching exposure, respectively, and mainly and schematically illustrate how regions are overlaid one on the other and a positional relation between the regions.

In the known stitching exposure illustrated in FIG. 2, a first inspection mark region 31a and a second inspection mark region 31b adjacent to each other are formed by performing exposure using the same mask (a mask for inspection mark regions). These inspection mark regions 31a and 31b each have overlay inspection marks 41 residing at its four corners, respectively. Next, a first element region 32 that overlaps with the first inspection mark region 31a and that has the same area as that of the first inspection mark region 31a is formed by using a first mask having a pattern for forming a semiconductor element. In this process, the positions of the mask and the semiconductor substrate are adjusted so that the inspection marks 41 on the first inspection mark region 31a are aligned with respective inspection marks 42 on the first element region 32. Next, a second element region 33 that overlaps with the second inspection mark region 31b and that has the same area as that of the second inspection mark region 31b is formed by using a second mask. In this process, the positions of the mask and the semiconductor substrate are adjusted so that the inspection marks 41 on the second inspection mark region 31b are aligned with the inspection marks 42 on the second element region 33, respectively. The exposure region of the first mask has the same area as that of the second mask, but the first and second masks may have different patterns.

In this manner, it is possible to form a semiconductor element having a size obtained by combining the first element region 32 and the second element region 33 together.

In this process, the stitching accuracy is improved by forming the inspection mark regions 31a and 31b through exposure of these regions using the same mask. However, since the area of each of the first element region 32 and the second element region 33 is the same as that of the inspection mark region 31a (or the inspection mark region 31b), a stitch 35 between these regions is fixed to the center of the entire semiconductor device, and thus the position of the stitch 35 cannot be flexibility set. As a result, when misalignment occurs at the stitch, the performance of the semiconductor device may remarkably deteriorate, or for example, the size of the semiconductor device is increased, because the layout of the semiconductor element is limited to prevent the deterioration.

In contrast to the foregoing exposure, the stitching exposure of the present disclosure illustrated in FIG. 1 is also performed using the same mask (a mask for inspection mark regions), thereby forming a plurality of first inspection mark regions 51a and a plurality of second inspection mark regions 51b. However, four corners of each of these inspection mark regions 51a and 51b each have at least two overlay inspection marks. More specifically, first overlay inspection marks 61a are each disposed to be close to an associated one of the four corners, and second overlay inspection marks 61b are each disposed to be closer to the associated corner than the first overlay inspection marks 61a are. The first and second overlay inspection marks 61a and 61b are arranged side by side in the direction in which the first and second inspection mark regions 51a and 51b are arranged side by side.

Using the first and second inspection mark regions 51a and 51b as described above makes it possible to accurately form a first element region 52 and a second element region 53 having different areas through the stitching exposure.

In other words, the first element region 52 that overlaps with a portion of the first inspection mark region 51a and that has an area smaller than that of the first inspection mark region 51a is formed by using the first mask having a pattern for forming a semiconductor element. In this process, the positions of the mask and the semiconductor substrate are adjusted so that the first overlay inspection marks 61a on the first inspection mark region 51a are aligned with inspection marks 62a on the first element region 52, respectively. Next, the second element region 53 that has a portion overlapping with the second inspection mark region 51b and that has an area larger than that of the second inspection mark region 51b is formed by using the second mask. In this process, the positions of the mask and the semiconductor substrate are adjusted so that the second overlay inspection marks 61b on the second inspection region 51b are aligned with inspection marks 62b on the second element region 53, respectively.

As can be seen from the foregoing description, just like the known stitching process, it is possible to form a semiconductor element having a size obtained by combining the first element region 52 and the second element region 53 together. Also in this case, the stitching accuracy is improved by forming the inspection mark regions 51a and 51b through exposure of these regions using the same mask. Moreover, since the first element region 52 and the second element region 53 may be formed to have different areas, the position of a stitch 55 is not limited to the center of the entire semiconductor device, but can be determined as required. Consequently, for example, in the case of an imaging device, it is possible to prevent the stitch from being positioned at the center of the imaging region, and even if the acquired image is not continuous, it is possible to reduce the degree to which a viewer feels something strange. Note that in FIG. 1, the inspection mark regions 51a and 51b are adjacent to each other (disposed without a gap interposed therebetween). However, this feature is not essential.

Embodiments of the present disclosure will now be described using a more specific semiconductor device as an example.

First Embodiment

Figure 3:
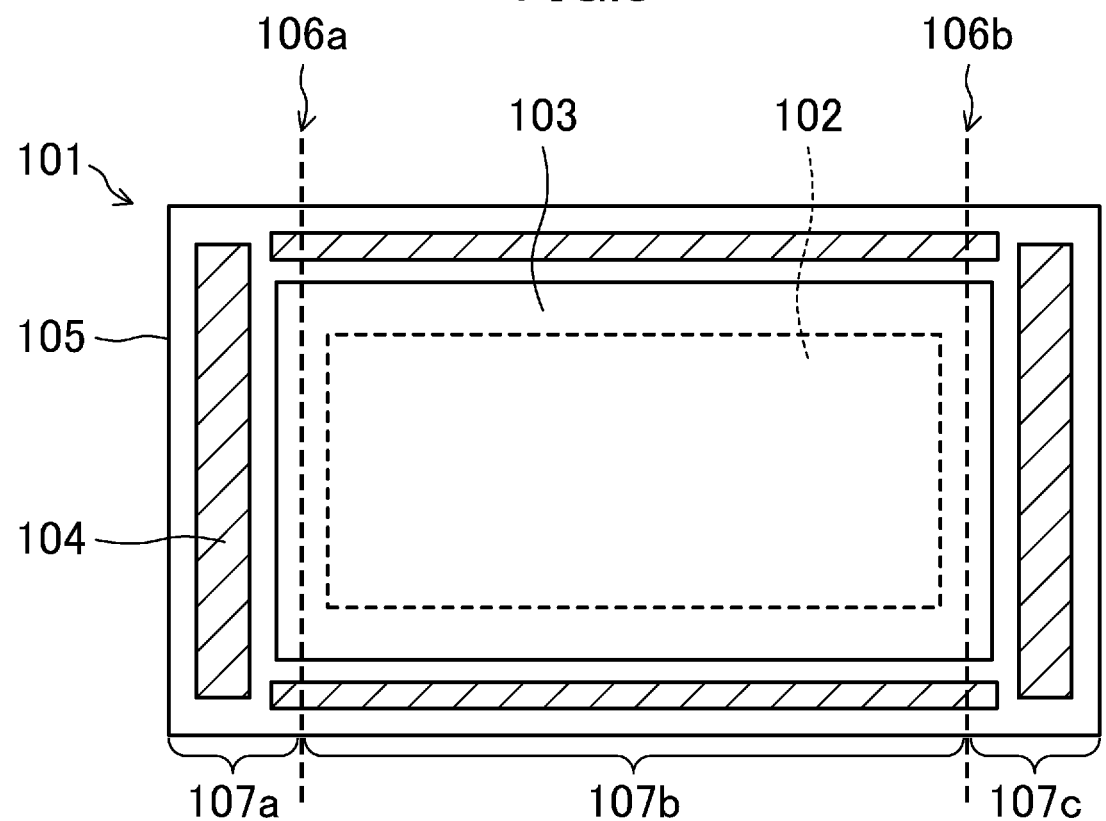
FIG. 3 is a plan view schematically illustrating an exemplary semiconductor device of the present disclosure.

FIG. 3 is a schematic plan view of an exemplary semiconductor device 101 of the present disclosure. The semiconductor device 101 is a solid-state imaging device, and includes an imaging section 102 at the center, and an imaging section 103 that includes the imaging section 102. Peripheral circuits 104 are provided around the semiconductor device 101, and a scribe region 105 is also located around the device. In this example, elements inside the inner imaging section 102 are used to take a moving image, and elements inside the imaging section 103 (both elements inside the inner imaging section 102 and elements outside the imaging section 102) are used to take a still image.

The pattern of the semiconductor device 101 is divided into a plurality of (three in this example) patterns 107a, 107b, and 107c by stitches 106a and 106b. The semiconductor device 101 is manufactured by joining the patterns 107a, 107b, and 107c through stitching exposure.

For the sake of simplicity, in the following description, it is assumed that the semiconductor device 101 is configured as a semiconductor element including an isolation layer and a gate electrode layer. However, naturally, this is merely an example of the present disclosure.

Figure 4:
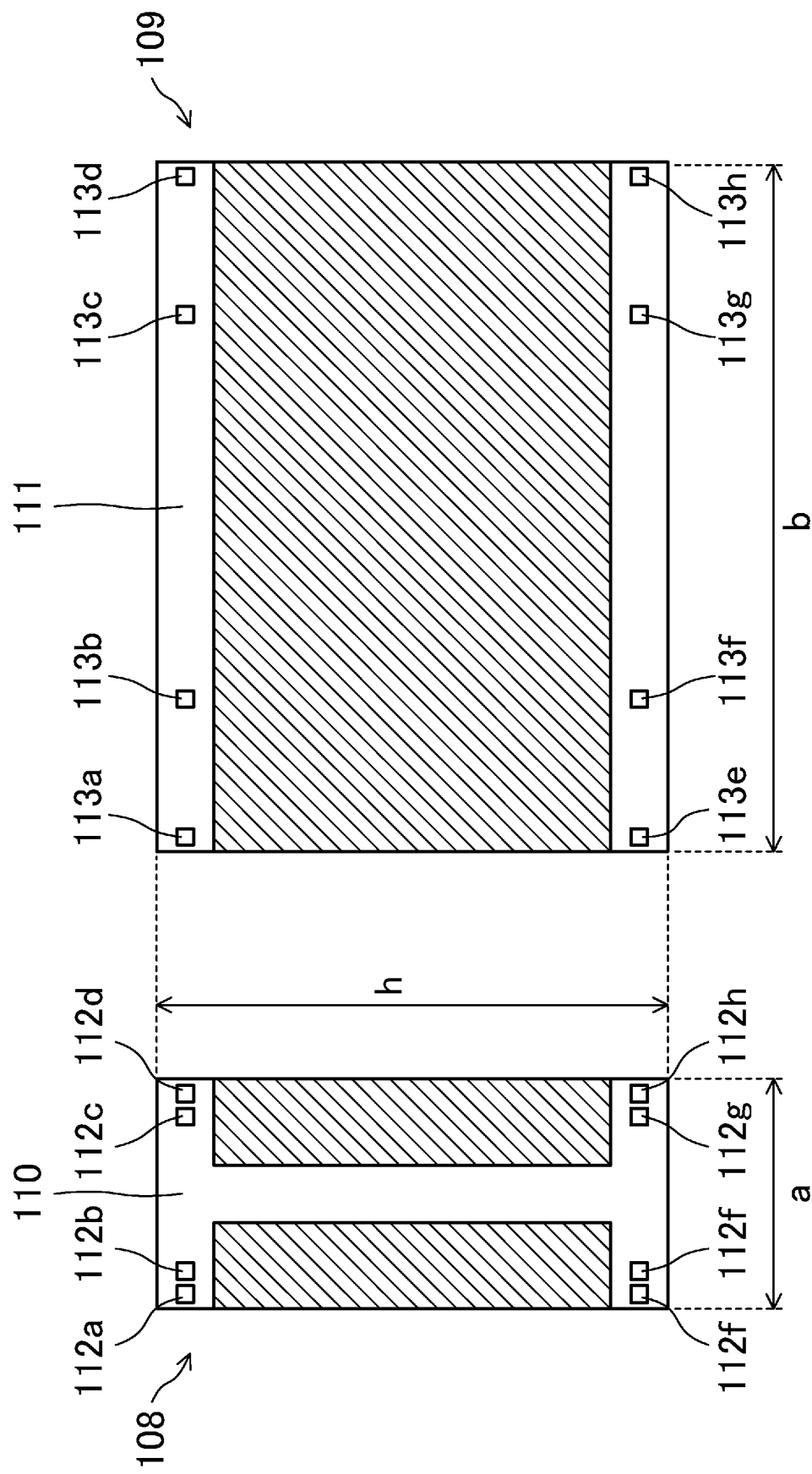
FIG. 4 is a schematic plan view of a mask for use to form a pattern of an isolation layer in a first embodiment of the present disclosure.

FIG. 4 illustrates a first element forming mask 108 and a second element forming mask 109 for use in the stitching exposure for forming the isolation layer of the semiconductor device 101. In this example, the pattern of the semiconductor device 101 is divided so that the mask 108 includes the patterns 107a and 107c in FIG. 3 and the mask 109 includes the pattern 107b. Moreover, the mask 109 includes a large portion of the imaging section 103 and the entire imaging section 102. Although described below in detail, the patterns are formed by repeatedly using the masks 108 and 109, thereby forming a pattern of the entire semiconductor device in which the pattern 107b is sandwiched between the pattern 107a and the pattern 107c.

An exposure region 110 of the element forming mask 108 is formed in a rectangular shape having a height h and a width a, and has a size of a×h. An exposure region 111 of the element forming mask 109 is formed in a rectangular shape having a height h and a width b, and has a size of b×h. In this manner, the exposure regions of the divided masks have the same height, but different widths. As a result, the exposure regions have different areas. This is one of features of the present disclosure.

In addition to the pattern of the semiconductor element, the mask 108 further includes overlay inspection marks 112a to 112h, and the mask 109 further include overlay inspection marks 113a to 113h. Although not shown, the masks 108 and 109 also include alignment marks, a size inspection pattern, and other suitable patterns in addition to the foregoing marks.

Figure 5:
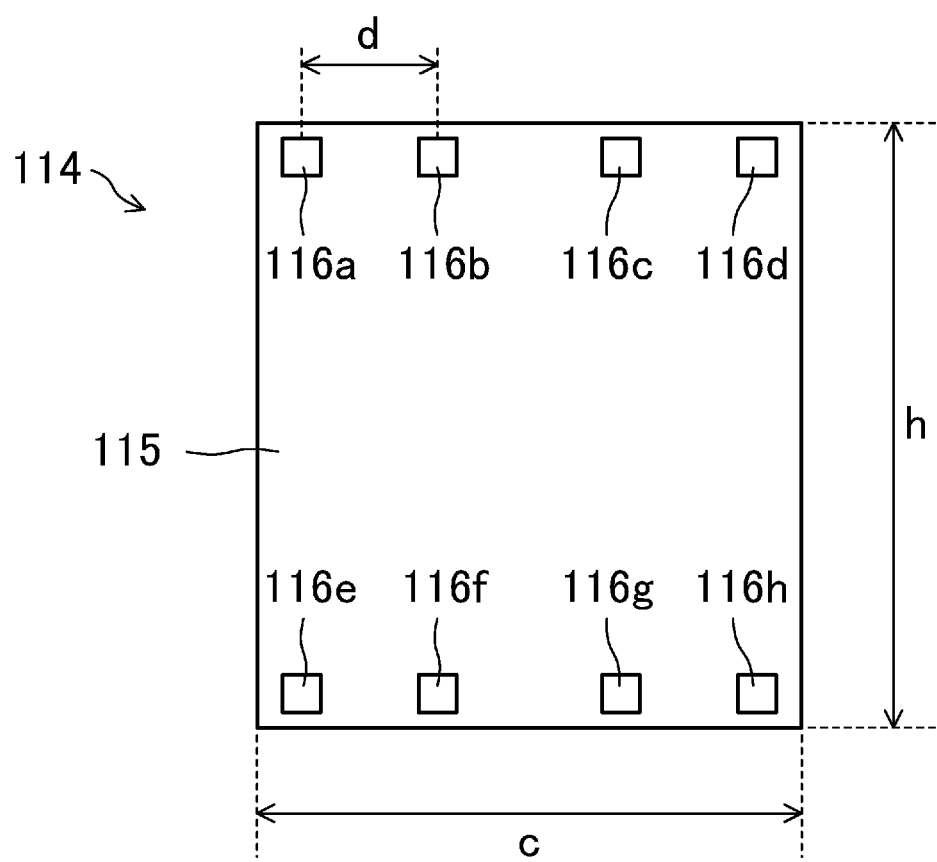
FIG. 5 is a schematic plan view of a mask for use to form overlay inspection marks before the formation of the isolation layer in the first embodiment of the present disclosure.

To accurately join the patterns 107a, 107b, and 107c, overlay inspection marks, alignment marks, and other marks are formed through exposure using a single mask, before the formation of the pattern of the isolation layer. FIG. 5 illustrates an inspection mark mask for use to form such overlay inspection marks. An inspection mark mask 114 includes only patterns to be formed in a scribe region, such as patterns of the overlay inspection marks, the alignment marks (not illustrated), and other marks, and does not include a pattern for forming a semiconductor element. In this example, an exposure region 115 of the inspection mark mask 114 has a height h, a width c, and a size of c×h. The width c is equal to a value obtained by calculating the sum of the width a of the exposure region 110 of the element forming mask 108 and the width b of the exposure region 111 of the element forming mask 109, and dividing the sum by 2, i.e., (a+b)/2. As a result, the total exposure area of the element forming masks 108 and 109 is equal to twice the exposure area of the inspection mark mask 114.

Moreover, at least two overlay inspection marks are disposed around each of the four corners of the inspection mark mask 114. In this example, inspection marks 116a, 116d, 116e, and 116h (second inspection marks) are disposed at the four corners of the inspection mark mask 114, respectively, and inspection marks 116b, 116c, 116f, and 116g (first inspection marks) are disposed to be closer to the inside of an inspection mark region along the sides in the width c direction than the respective inspection marks 116a, 116d, 116e, and 116h.

Figure 6:
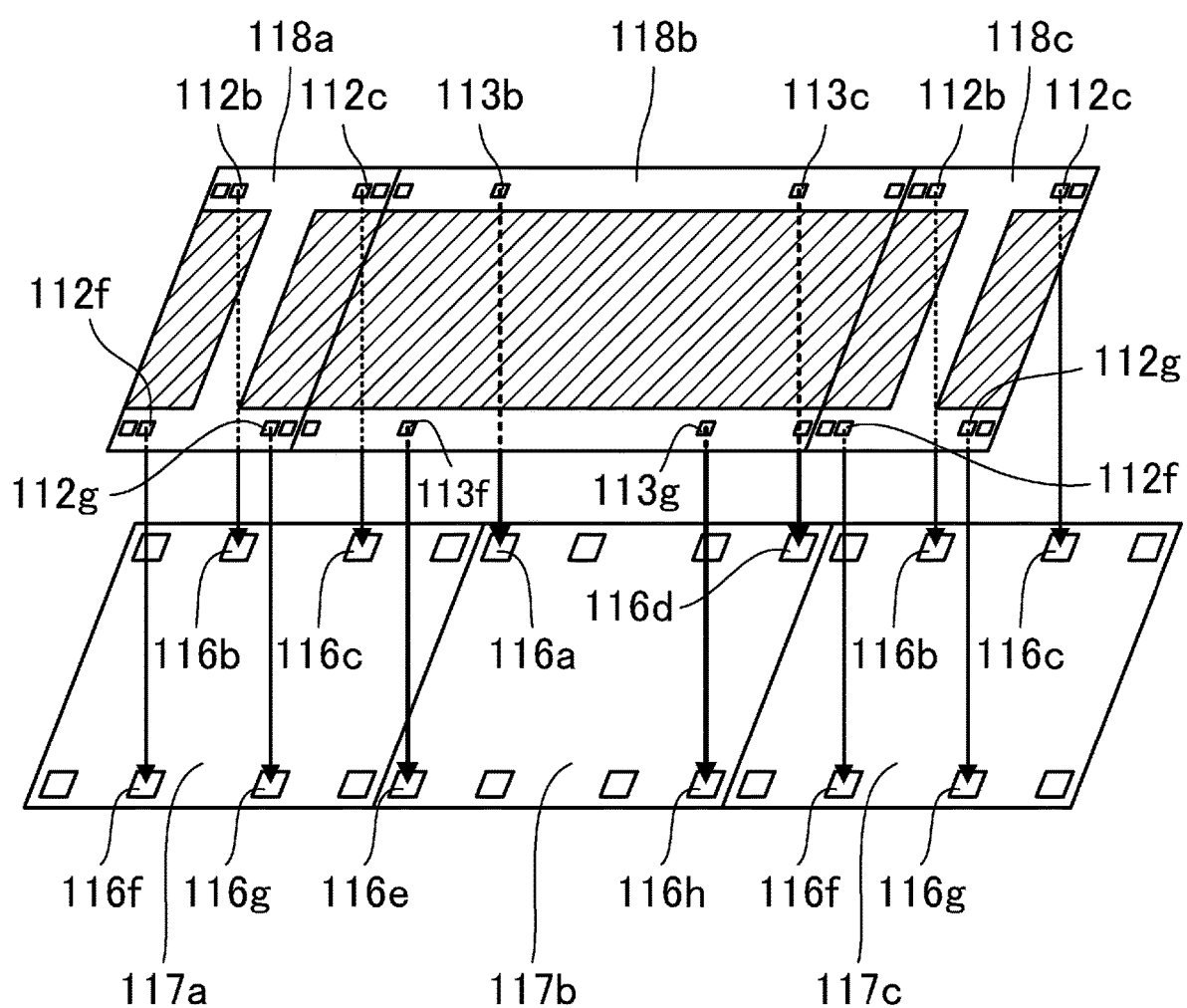
FIG. 6 is a perspective view schematically illustrating the position of a pattern of the isolation layer relative to the overlay inspection marks in the first embodiment of the present disclosure.

Next, one of process steps for manufacturing the semiconductor device 101 is illustrated in FIG. 6. In this example, inspection mark regions 117a, 117b, and 117c are exposed using the same inspection mark mask 114 with an exposure machine so that the regions to be exposed are adjacent to each other, and are further developed, thereby forming the overlay inspection marks. Performing exposure using a single mask in this manner eliminates the risk of misalignment of the patterns on the mask, and can thus eliminate misalignment between the mask and the mask stage of the exposure machine. Consequently, it is possible to perform highly accurate exposure. In this process, a region of the inspection mark mask 114 where a single exposure region overlaps with an adjacent exposure region may be determined, and the overlay inspection marks between the determined region and regions adjacent to the determined region may be disposed on the mask 114. Aligning adjacent regions using such marks improves the accuracy of alignment and any other process.

The semiconductor substrate is etched or subjected to any other process by using the pattern obtained through such exposure, and a resist film is removed after the overlay inspection marks, the alignment marks, and other marks are formed on the semiconductor substrate.

Then, a pattern of the isolation layer is formed by using the element forming masks 108 and 109. To do so, first, an oxide film and a nitride film are formed, and a resist is applied to these films. Then, as illustrated in FIG. 6, exposure is carried out by performing alignment using the overlay inspection marks 116a and 116g formed in advance. More specifically, exposure is performed by adjusting the positions of the mask 108 and the semiconductor substrate so that the overlay inspection marks 112b, 112c, 112f, and 112g of the element forming mask 108 overlap with the respective overlay inspection marks 116b, 116c, 116f, and 116g of the inspection mark region 117a. In this manner, the pattern of the isolation layer is formed in an element region 118a. Moreover, exposure is performed by adjusting the positions of the mask 109 and the semiconductor substrate so that the overlay inspection marks 113b, 113c, 113f, and 113g of the element forming mask 109 overlap with the respective overlay inspection marks 116a, 116d, 116e, and 116h of the inspection mark region 117b. Consequently, the pattern of the isolation layer is formed in an element region 118b.

The inspection mark regions (117a and 117b) and the element regions 118a and 118b formed by being aligned with the inspection mark regions (117a and 117b) all have needed to have the same size. In contrast to the known art, forming more overlay inspection marks in the inspection mark region than in the known example increases flexibility in the size of each of the element regions 118a and 118b. Consequently, it is possible to set the stitches at desirable locations.

Also for the inspection mark region 117c, the pattern of the isolation layer is formed in the element region 118c, by aligning the overlay inspection marks 112b, 112c, 112f, and 112g on the element forming mask 108 with the respective overlay inspection marks 116b, 116c, 116f, and 116g on the inspection mark region 117c and then performing exposure.

In this manner, as illustrated in FIGS. 3, 4, and 6, a pattern corresponding to the entire semiconductor device 101 is formed. This pattern includes the pattern 107b of the element region 118b formed using the mask 109, the pattern 107a of the element region 118a formed using the mask 108 on one side (left side in FIG. 6) of the pattern 107b, and the pattern 107c of the element region 118c formed using the mask 108 on the other side (right side in FIG. 6) of the pattern 107b.

Figure 7:
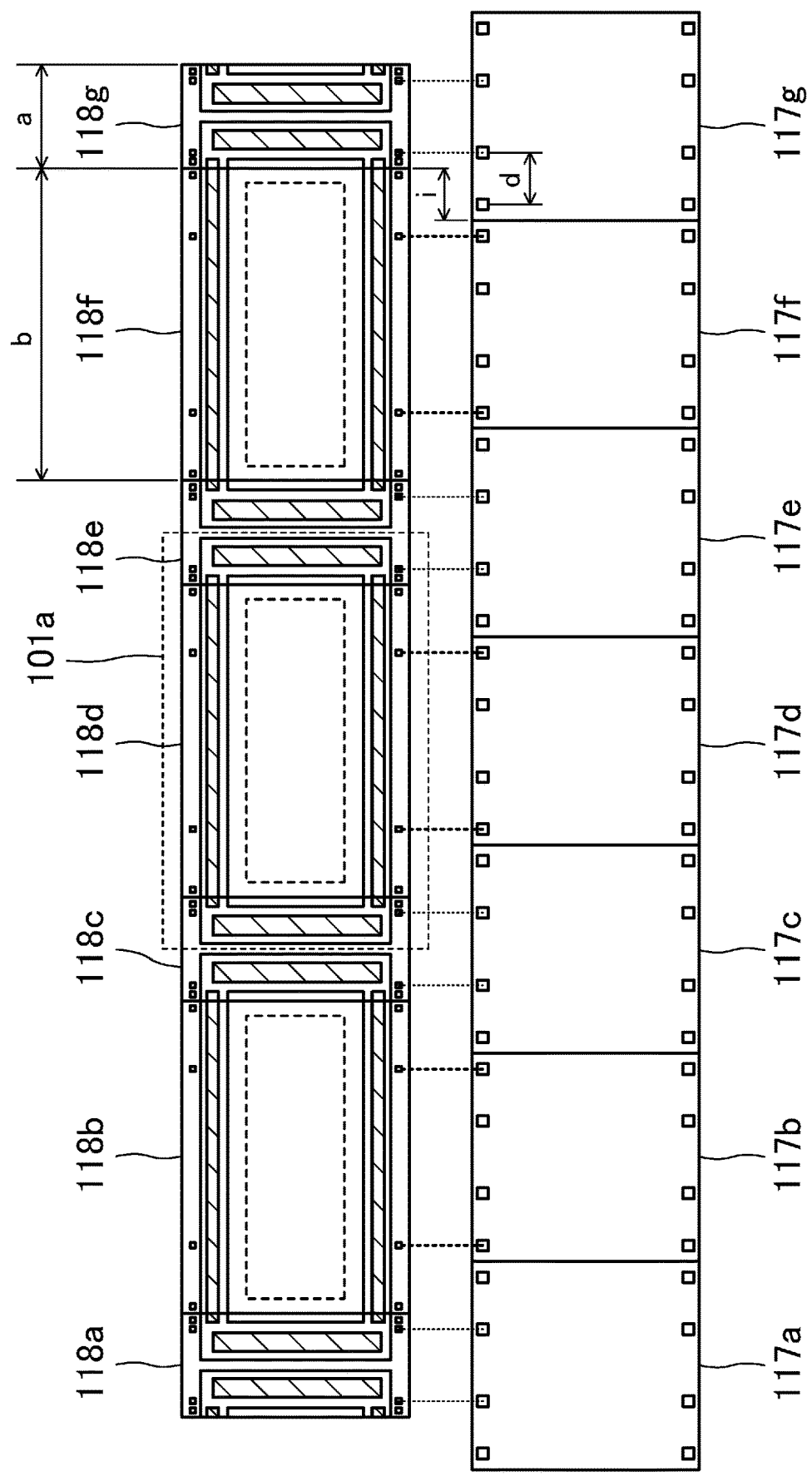
FIG. 7 is a diagram schematically illustrating a layout of patterns each obtained when a pattern of a layer including the overlay inspection marks and a semiconductor element is repeatedly exposed in the first embodiment of the present disclosure.

In the present embodiment, the pattern formation using the element forming masks 108 and 109 in an alternate manner as described above is repeated. This is further illustrated in FIG. 7. FIG. 7 illustrates a positional relation between the inspection mark regions (117a to 117g) that are repeatedly formed by using the inspection mark mask 114, and the element regions (118a to 118g) formed by being aligned with the overlay inspection marks formed in the inspection mark regions (117a to 117g) and alternately and repeatedly using the element forming masks 108 and 109. A portion corresponding to a single semiconductor device 101 is illustrated as a region 101a.

After the exposure described above is performed, and the development is completed, whether or not the substrate and the mask are accurately overlaid one on the other is examined by using the overlay inspection marks included in the acquired pattern. When the overlaying accuracy meets a predetermined standard, the resist is removed after the nitride film is etched to expose the oxide film. When the overlaying accuracy does not meet the predetermined standard, exposure is performed again after removal of the resist. In other words, a resist is applied again after the removal of the resist, the measured value in the overlaying inspection is fed back to adjust the stage position of the exposure machine and other factors, and in this state, exposure is performed.

A trench is formed by etching the oxide film and the semiconductor substrate using the obtained nitride film pattern as a hard mask. After the trench is filled with an insulating material, an unnecessary portion of the insulating material is removed by chemical mechanical polishing (CMP), thereby forming an isolation.

After the formation of the isolation layer in this manner, a gate oxide film is formed, and a polysilicon layer that is a material for a gate electrode is formed on the gate oxide film.

Figure 8:
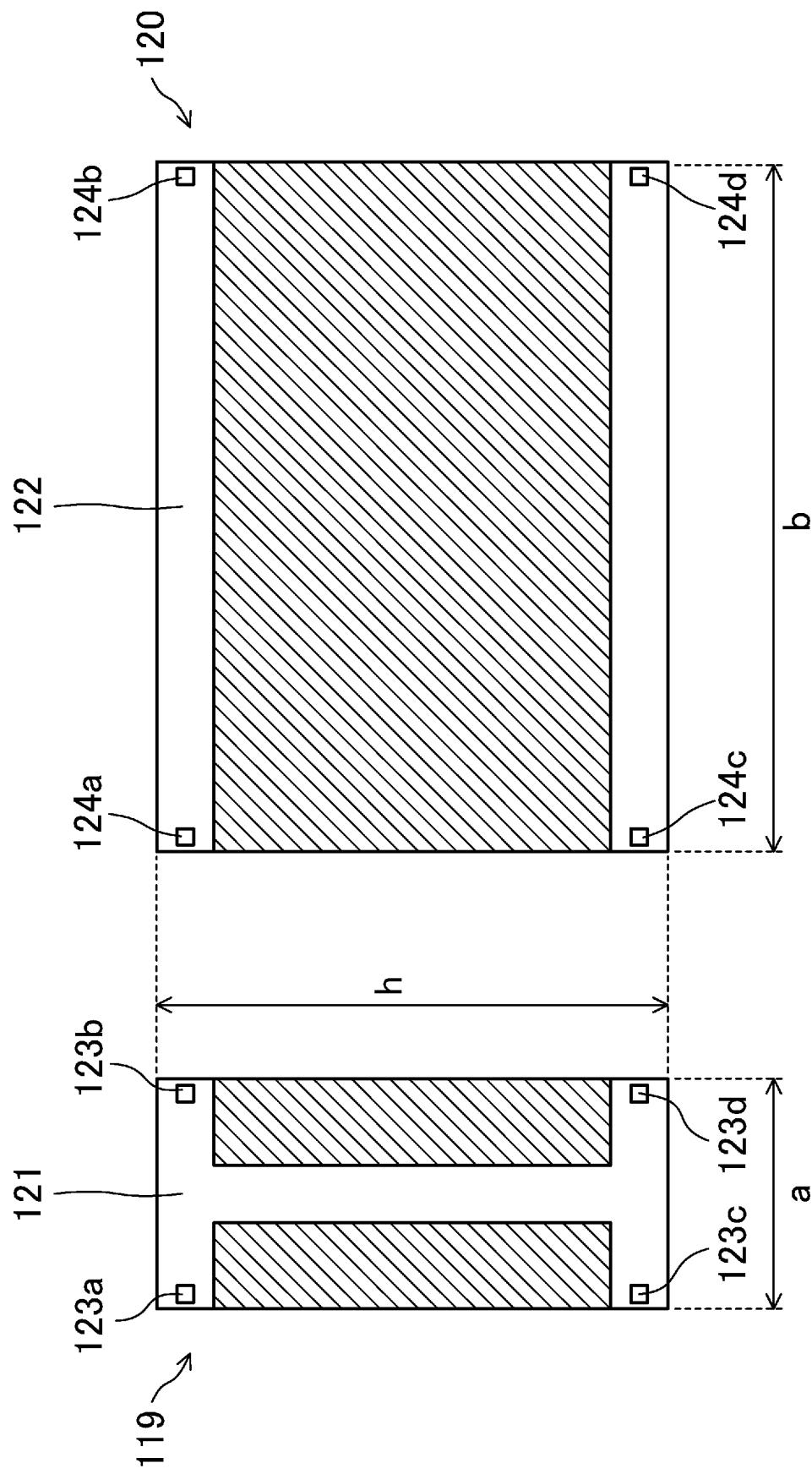
FIG. 8 is a schematic plan view of a mask for use to form a pattern of a gate electrode layer in the first embodiment of the present disclosure.

FIG. 8 illustrates a mask for use to form a gate electrode. An exposure region 121 of the gate electrode forming mask 119 is formed in a rectangular shape having a height h and a width a, and has a size of a×h. The size of the exposure region 121 is the same as that of the exposure region 110 of the first element forming mask 108. An exposure region 122 of a gate electrode forming mask 120 is formed in a rectangular shape having a height h and a width b, and has a size of b×h. The size of the exposure region 122 is the same as that of the exposure region 111 of the second element forming mask 109. In addition to the pattern of the semiconductor element, the gate electrode forming mask 119 further includes overlay inspection marks 123a to 123d, and the gate electrode forming mask 120 further includes overlay inspection marks 124a to 124d. Although not shown, the gate electrode forming masks 119 and 120 further include alignment marks, a size inspection pattern, and other suitable patterns in addition to the foregoing marks.

Figure 9:
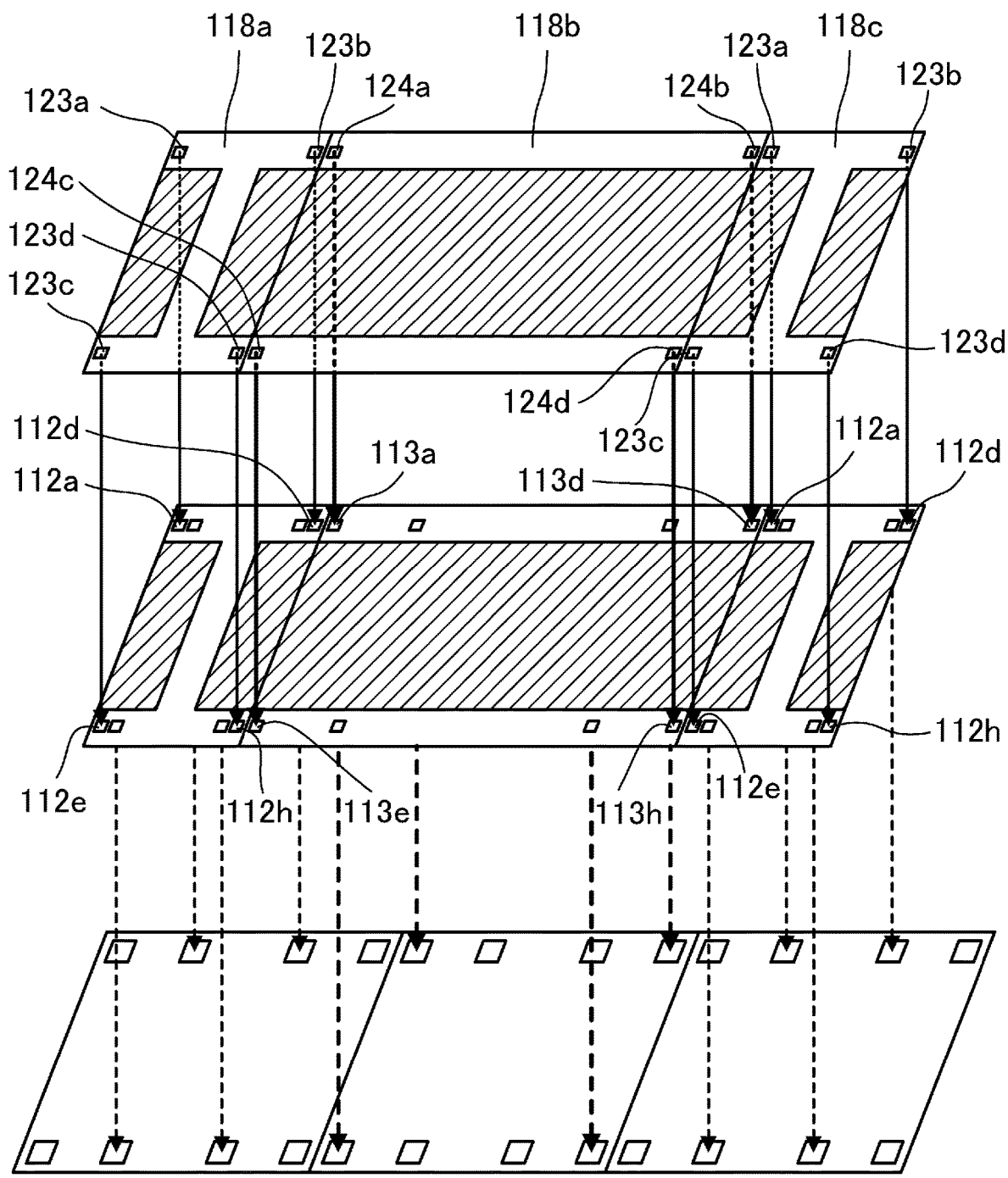
FIG. 9 is a perspective view schematically illustrating the position of the pattern of the gate electrode layer relative to the pattern of the isolation layer in the first embodiment of the present disclosure.

To form the gate electrode layer, exposure using the gate electrode forming masks 119 and 120 is performed after a resist is applied to the semiconductor substrate including a polysilicon layer. This is illustrated in FIG. 9. The positions of the mask and the semiconductor substrate are adjusted so that the overlay inspection marks 123a, 123b, 123c, and 123d of the gate electrode forming mask 119 overlap with the respective overlay inspection marks 112a, 112d, 112e, and 112h of the element region 118a formed using the first element forming mask 108 in the preceding process, and in this state, exposure is performed. Consequently, a pattern of the gate electrode is formed in the element region 118a. Then, the positions of the mask and the semiconductor substrate are adjusted so that the overlay inspection marks 124a, 124b, 124c, and 124d of the gate electrode forming mask 120 overlap with the respective overlay inspection marks 113a, 113d, 113e, and 113h of the element region 118b formed using the second element forming mask 109, and in this state, exposure is performed. Consequently, a pattern of the gate electrode is formed in the element region 118b.

After the exposure described above is performed, and the development is completed, whether or not the substrate and the mask are accurately overlaid one on the other is examined by using the overlay inspection marks included in the obtained pattern. If a large region such as the element region 118b is exposed, a pattern distortion tends to occur at an end of the region. However, creating the masks 119 and 120 so that the overlay inspection marks are disposed at ends of the element region 118b the pattern distortion during the exposure to be more accurately fed back. Consequently, it is possible to overlay the pattern of the element isolation and the pattern of the gate electrode one on the other with higher accuracy.

A gate electrode is formed by etching the polysilicon layer using the obtained pattern, and removing the resist. Consequently, the semiconductor device 101 including the isolation layer and the gate electrode layer is manufactured. As described at first, only the two layers have been described in this example. However, the method described above is applicable to any layer that is to undergo stitching exposure, such as an interconnect, a hole pattern, and a pattern for use in ion injection. Moreover, it is possible to form a pattern using the overlay inspection marks and the alignment marks formed using the inspection mark mask 114 before the formation of the isolation layer, and further perform a process such as ion injection and etching. Furthermore, it is possible to form a pattern using the overlay inspection marks and the alignment marks formed using the inspection mark mask 114 after the formation of the isolation layer, and further perform a process such as ion injection and etching.

Figure 16:
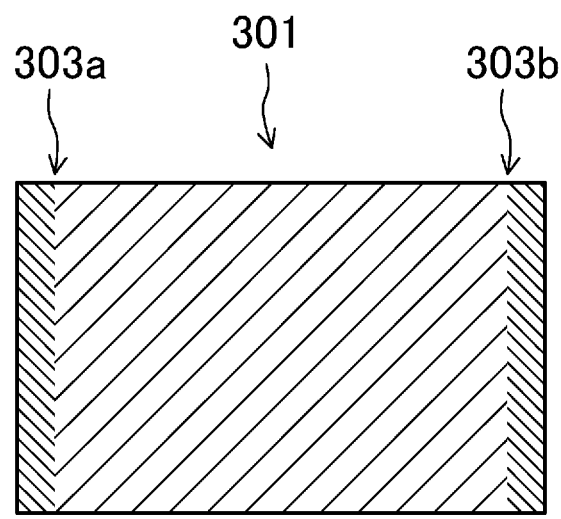
FIG. 16 illustrates an image acquired by the semiconductor device of the present disclosure.
Figure 17:
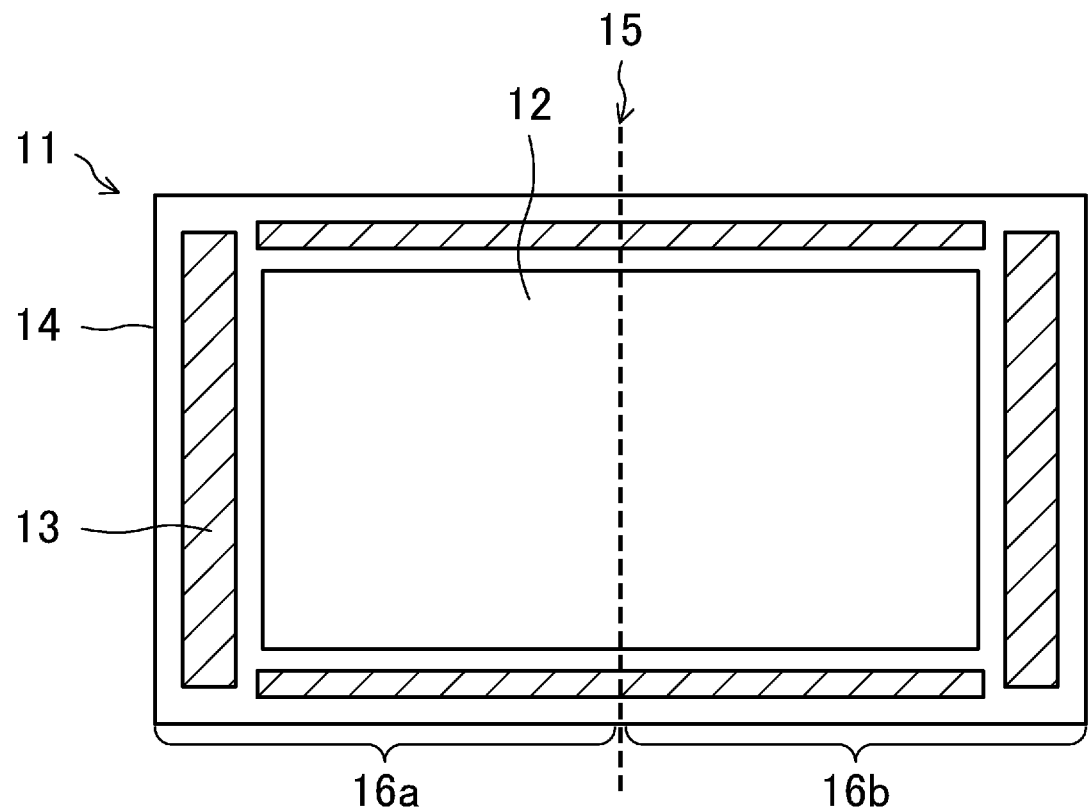
FIG. 17 is a plan view schematically illustrating a known semiconductor device.

FIG. 16 illustrates an example of an image taken by the manufactured semiconductor device 101.

Figure 18:
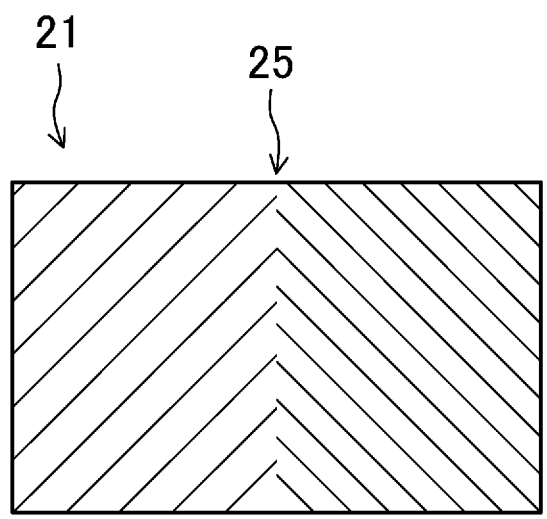
FIG. 18 illustrates an image acquired by the semiconductor device in FIG. 17.

A still image 301 is acquired by the imaging section 103 (including the imaging section 102) illustrated in FIG. 3. Since the stitches 106a and 106b are present near both ends of the imaging section 103, even if the stitches become apparent due to a slight misalignment of patterns, stitches 303a and 303b that have become apparent are located near both ends of the still image 301. This still image causes a viewer to feel less strange than a known acquired image 21 illustrated in FIG. 18. In other words, the known acquired image 21 causes a viewer to strongly feel something strange, because the stitch 25 that has become apparent is located at a conspicuous portion around the center. However, the still image 301 of the present embodiment significantly reduces the degree to which a viewer feels something strange, because the stitches 303a and 303b that have become apparent are close to the ends of the image, and do not affect a major portion of the image.

The distance d (see FIG. 5) between the centers of the inspection marks (for example, the inspection mark 116a and the inspection mark 116b) disposed at the same corner of the inspection mark mask 114 is substantially equal to half of the difference between the width a of the exposure region 110 of the element forming mask 108 and the width c of the exposure region 115 of the inspection mark mask 114, i.e., (c−a)/2. The distance d is also substantially equal to half of the difference between the width b of the exposure region 111 of the element forming mask 109 and the width c of the exposure region 115 of the inspection mark mask 114, i.e., (b−c)/2. Consequently, it is possible to dispose each inspection mark in a desirable region.

This will be described with reference to FIGS. 6 and 7. First, to improve the alignment, it is preferable that the inspection marks used during exposure are disposed at separate positions in the single mask. To do so, it is preferable to bring the inspection marks as close to the four corners as possible.

Consequently, as illustrated in FIGS. 5 and 6, and other figures, to align the element forming mask 109 for exposing the element region 118b (a larger one of the two types of large and small element regions), the inspection marks 116a, 116d, 116e, and 116h are positioned on portions of the four corners of the inspection mark region (117b) as close to outside as possible. These inspection marks thus positioned are utilized.

Moreover, to align the element forming mask 108 for exposing the element region 118a or 118c (a smaller one of the two types of large and small element regions), the inspection marks 116b, 116c, 116f, and 116g are positioned toward the inside of the inspection mark region (117a or 117c). Such positions of these marks are utilized. In this process, to improve the alignment, it is recommended that the inspection marks 116b, 116c, 116f, and 116g be also brought as close to the outside of the inspection mark region (117a or 117c) as possible.

However, when the inspection marks are too close to the outside, a portion of the element region 118a or 118c facing the associated inspection mark falls outside the element region 118a or 118c, and falls within the element region 118b. Consequently, the inspection marks cannot be used for the alignment.

In other words, as illustrated in FIG. 7, when the distance i between the boundary of the inspection mark regions and the boundary of the element regions is taken into consideration, the inspection mark 116b or any other mark close to the inside needs to be disposed away from the boundary of the inspection mark regions by a distance longer than or equal to the distance i. Moreover, it is recommended that as long as the inspection mark 116b or any other mark is disposed away from the boundary of the inspection mark regions by a distance longer than or equal to the distance i as described above, the inspection mark 116b or any other mark close to the inside be closer to the boundary of the element regions (in other words, closer to the outside of the element region).

As illustrated in FIG. 7, in the present embodiment, the distance i is half of the difference between the width a or the width b, and the width c, i.e., (c−a)/2 or (b−c)/2. Thus, the distance between the centers of the inspection mark close to the outside (for example, the inspection mark 116a) and the inspection mark close to the inside (for example, the inspection mark 116b) at the same corner of the inspection mark region is preferably set to be about (c−a)/2 or (b−c)/2.

This allows the inspection marks to be positioned such that these inspection marks can be used for alignment and are as far from each other as possible, and improve the alignment of the two types of the element regions (the element regions 118a, 118b, and other element regions).

In the present embodiment, as illustrated in FIG. 6, the inspection marks 112b, 112c, 112f, and 112g for use to align the element regions 118a and 118b are respectively formed inside the inspection marks 112a, 112d, 112e, and 112h for use to align the gate electrode layer in a later process shown in FIG. 9. Accordingly, the inspection marks 116b, 116c, 116f, and 116g of the inspection mark region 117a are also formed inside to face the respective inspection marks 112b, 112c, 112f, and 112g. In this manner, the specific positions of the inspection marks may be determined with various elements taken into consideration.

Second Embodiment

A second embodiment will now be described. Also in the present embodiment, the exemplary semiconductor device 101 in FIG. 3 is used as an example.

Figure 10:
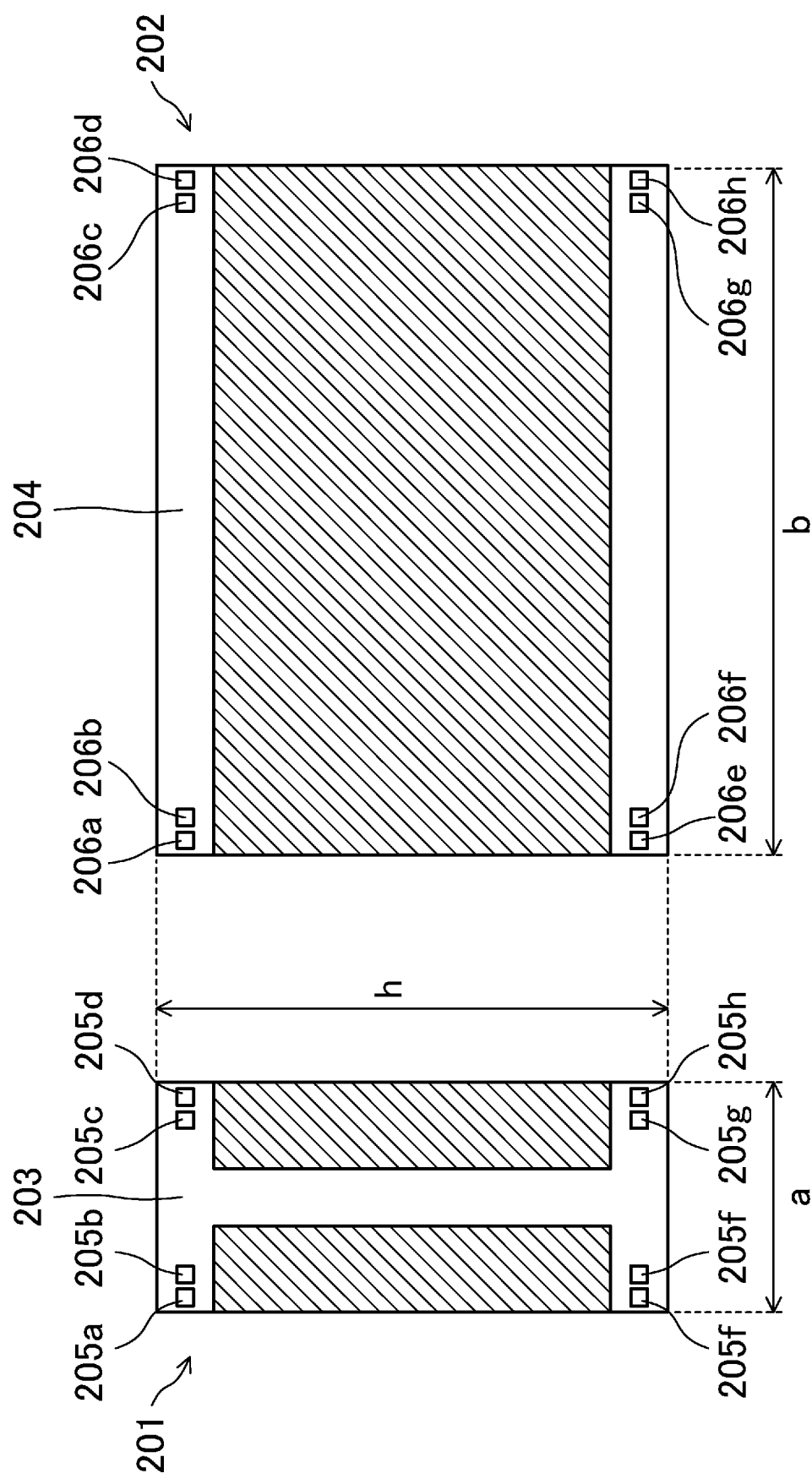
FIG. 10 is a schematic plan view of a mask for use to form a pattern of the isolation layer in a second embodiment of the present disclosure.

FIG. 10 illustrates a first element forming mask 201 and a second element forming mask 202 for use in stitching exposure to form an isolation layer of the semiconductor device 101 in the present embodiment.

As illustrated in FIG. 10, the first element forming mask 201 has an exposure region 203 formed in a rectangular shape having a height h and a width a. The first element forming mask 201 also includes overlay inspection marks 205a to 205h. The second element forming mask 202 has an exposure region 204 formed in a rectangular shape having a height h and a width b. The second element forming mask 202 also includes overlay inspection marks 206a to 206h.

These first and second element forming masks 201 and 202 respectively have generally the same configurations as those of the first and second element forming masks 108 and 109 in the first embodiment, and include patterns corresponding to the patterns 107a and 107c in FIG. 3. However, in the second element forming mask 202, the inner inspection marks (206b, 206c, 206f, and 206g) are closer to outside than the inspection marks (113b, 113c, 113f, and 113g) of the second element forming mask 109 in the first embodiment are.

Figure 11:
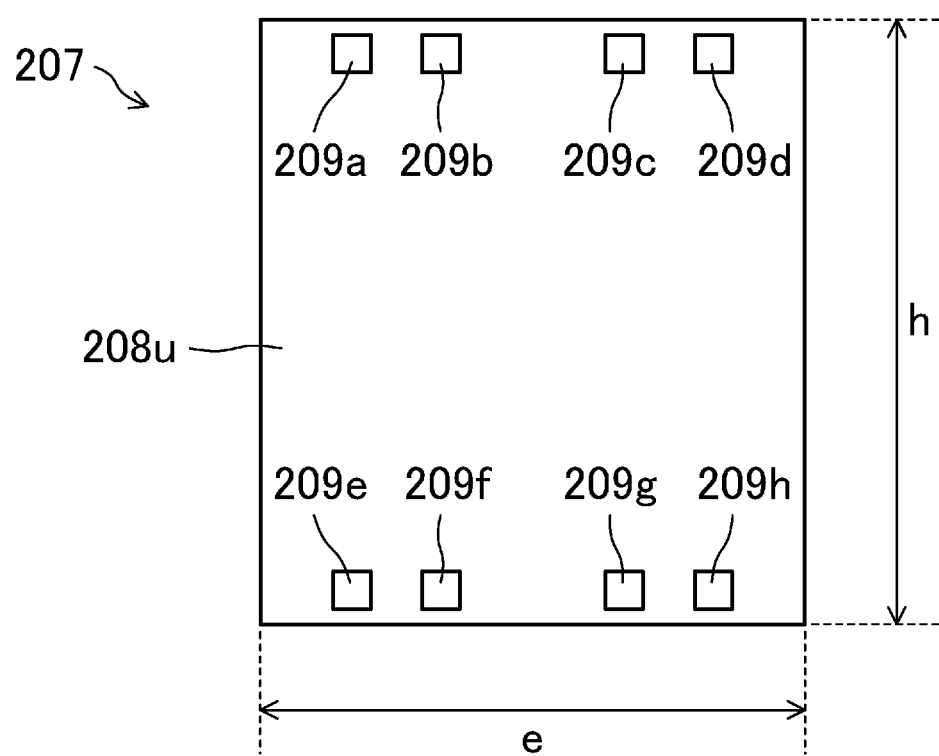
FIG. 11 is a schematic plan view of a mask for use to form overlay inspection marks before the formation of the isolation layer in the second embodiment of the present disclosure.

Also in the present embodiment, to accurately join the patterns 107a, 107b, and 107c, the overlay inspection marks, the alignment marks, and other marks are formed through exposure using a single mask, before the pattern of the isolation layer is formed. FIG. 11 illustrates an inspection mark mask 207 for forming the overlay inspection marks and other marks. The inspection mark mask 207 includes only a pattern of overlay inspection marks, alignment marks (not illustrated), and other marks to be formed in the scribe region, and does not include a pattern for forming a semiconductor element.

An exposure region 208 of the inspection mark mask 207 has a height h, a width e, and a size of e×h. In the present embodiment, the width e of the exposure region is larger than the width a of the exposure region of the first element forming mask 201, and smaller than the total width a+b of the exposure regions of the first and second element forming masks 201 and 202.

Figure 12:
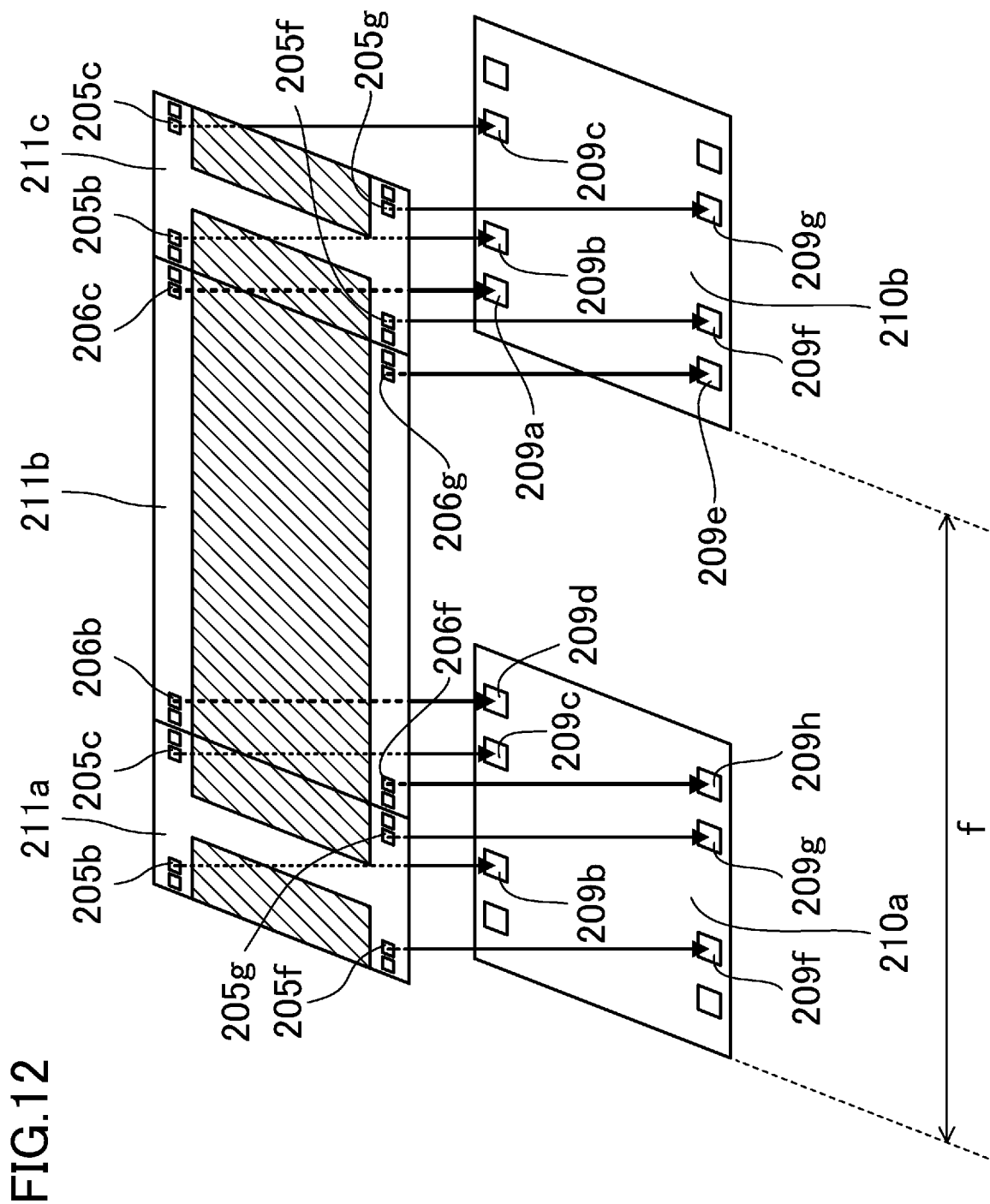
FIG. 12 is a perspective view schematically illustrating the position of the pattern of the isolation layer relative to the overlay inspection marks in the second embodiment of the present disclosure.

To form the overlay inspection marks in the present embodiment, the overlay inspection marks are formed using the same inspection mark mask 207 so that the regions to be exposed are not adjacent to each other and spaced apart from each other. This is illustrated in FIG. 12. After a single inspection mark region 210a is exposed, a step f (distance f) for moving the stage of the exposure machine for exposing the subsequent inspection mark region 210b is set to be equal to the total width a+b of the exposure regions 203 and 204 of the first and second element forming masks 201 and 202.

Also in the present embodiment, performing exposure using a single mask in this manner eliminates the risk of misalignment of the patterns on the mask, and can thus eliminate misalignment between the mask and the mask stage of the exposure machine.

After the exposure and development, the overlay inspection marks, the alignment marks, and other marks are formed on the semiconductor substrate by etching the semiconductor substrate, and a resist is removed.

A pattern of the isolation layer is then formed using the element forming masks 201 and 202.

To do so, first, an oxide film and a nitride film are formed, and a resist is applied to these films. Then, as illustrated in FIG. 12, the positions of the element forming mask 201 and the semiconductor substrate are adjusted so that the overlay inspection marks 205b, 205c, 205f, and 205g of the element forming mask 201 overlap with the respective overlay inspection marks 209b, 209c, 209f, and 209g of the region 210a, and in this state, exposure is performed. In this manner, the pattern of the isolation layer is formed in an element region 211a.

A pattern is also formed in an element region 211b using a plurality of inspection marks disposed in the two regions 210a and 210b. More specifically, the positions of the mask and the semiconductor substrate are adjusted so that the overlay inspection marks 206b and 206f of the element forming mask 202 overlap with respective overlay inspection marks 209d and 209h of the region 210a, and overlay inspection marks 206c and 206g of the element forming mask 202 overlap with respective overlay inspection marks 209a and 209e of the other region 210b, and in this state, exposure is performed.

Also in the present embodiment, flexibility in the size of each of the element region 211a and the element region 211b is increased by exposing the element region 211b using the overlay inspection marks in the inspection mark region 210a and the region 210b. Consequently, it is possible to set the stitches at desirable locations.

A pattern of the isolation layer is formed also on the element region 211c, by aligning the overlay inspection marks 205b, 205c, 205f, and 205g of the element forming mask 201 with the overlay inspection marks 209b, 209c, 209f, and 209g of the region 210b and then exposing the element region 211.

In this manner, a pattern corresponding to the entire semiconductor device 101 illustrated in FIG. 3 is formed.

Figure 13:
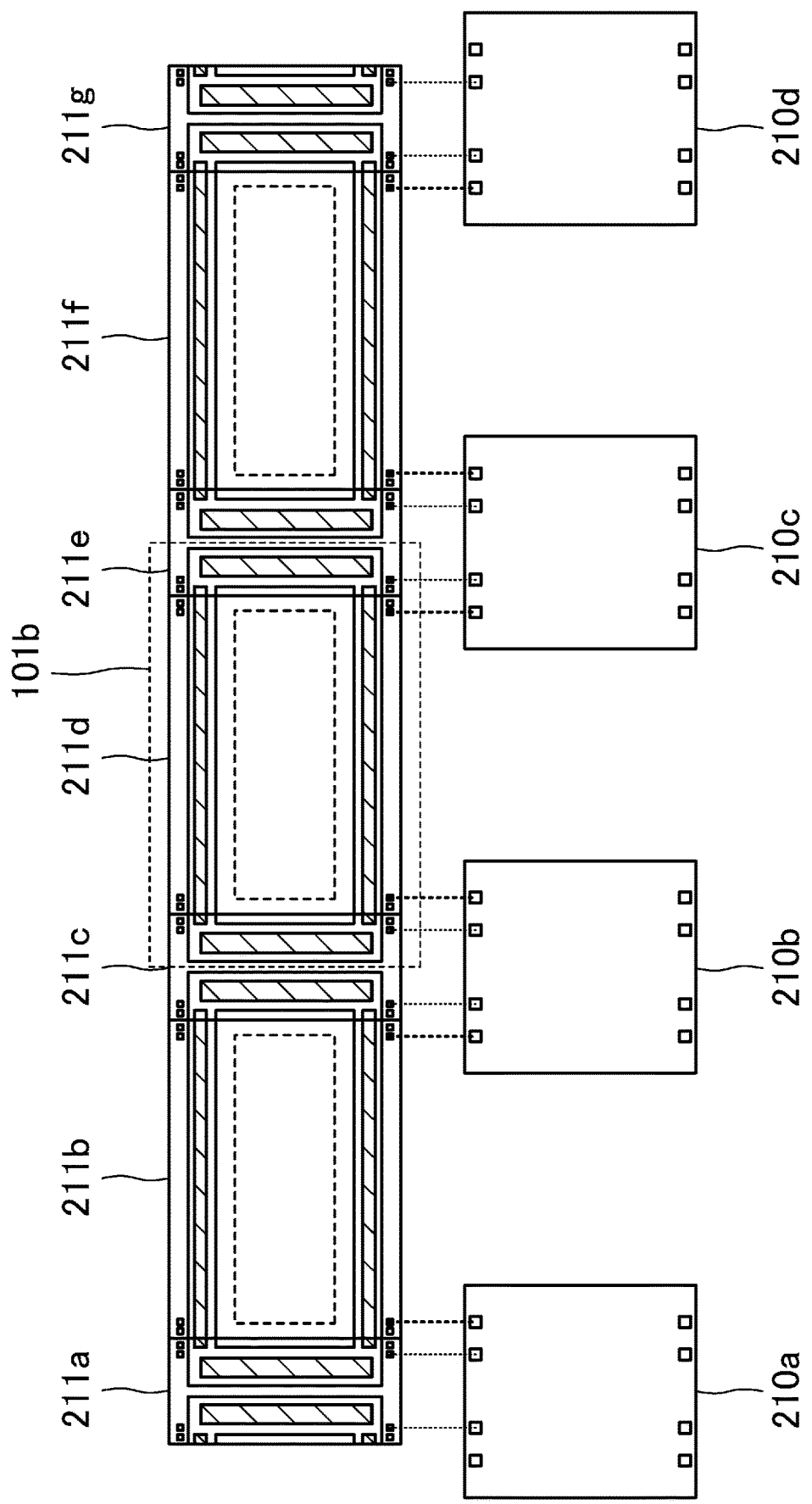
FIG. 13 is a diagram schematically illustrating a layout of patterns each obtained when a pattern of a layer including the overlay inspection marks and the semiconductor element is repeatedly exposed in the second embodiment of the present disclosure.

In the present embodiment, the pattern formation is repeated by alternately using the element forming masks 201 and 202 as described above. This is further illustrated in FIG. 13. In other words, FIG. 13 illustrates a positional relation between the inspection mark regions (210a to 210d) that are formed by repeatedly using the inspection mark mask 207, and the element regions (211a to 211g) that are formed by being aligned with the overlay inspection marks formed in the inspection mark regions (210a to 210d) and by alternately and repeatedly using the element forming masks 201 and 202. A portion corresponding to a single semiconductor device 101 is illustrated as a region 101b.

When the exposure and development are completed, whether or not the substrate and the mask are accurately overlaid one on the other is examined as in the first embodiment.

Subsequently, the isolation layer is formed as in the first embodiment. Moreover, after a gate insulating film and a polysilicon layer are formed, a gate electrode layer is formed by patterning the gate insulating film and the polysilicon layer.

Figure 14:
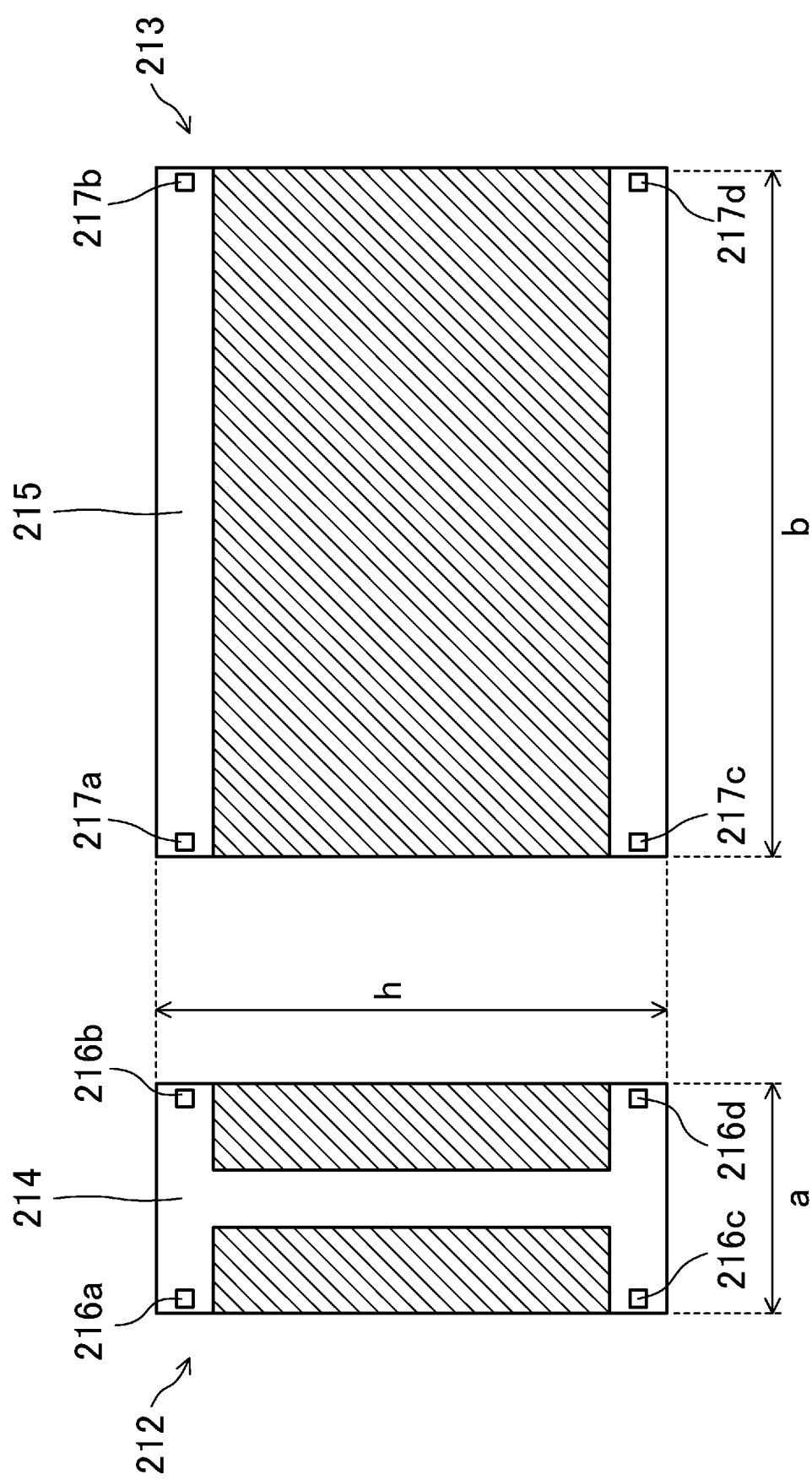
FIG. 14 is a schematic plan view of a mask for use to form a pattern of a gate electrode layer in the second embodiment of the present disclosure.

FIG. 14 illustrates a mask for use to form a gate electrode. These element forming masks 212 and 213 have the same configuration as those of the masks (119 and 120 in FIG. 8) for use to form the gate electrode in the first embodiment. In other words, an exposure region 214 of the element forming mask 212 has a size of a×h, which is equal to the size of the exposure region 203 of the element forming mask 201 for forming the isolation layer illustrated in FIG. 10, and an exposure region 215 of the element forming mask 213 has a size of b×h, which is equal to the size of the exposure region 204 of the element forming mask 202 for forming the isolation layer illustrated in FIG. 10. Moreover, the element forming masks 212 and 213 include overlay inspection marks 216a to 216d and 217a to 217d, in addition to the pattern of the semiconductor element. Although not illustrated, the element forming masks 212 and 213 further include alignment marks, a size inspection pattern, and other patterns.

Figure 15:
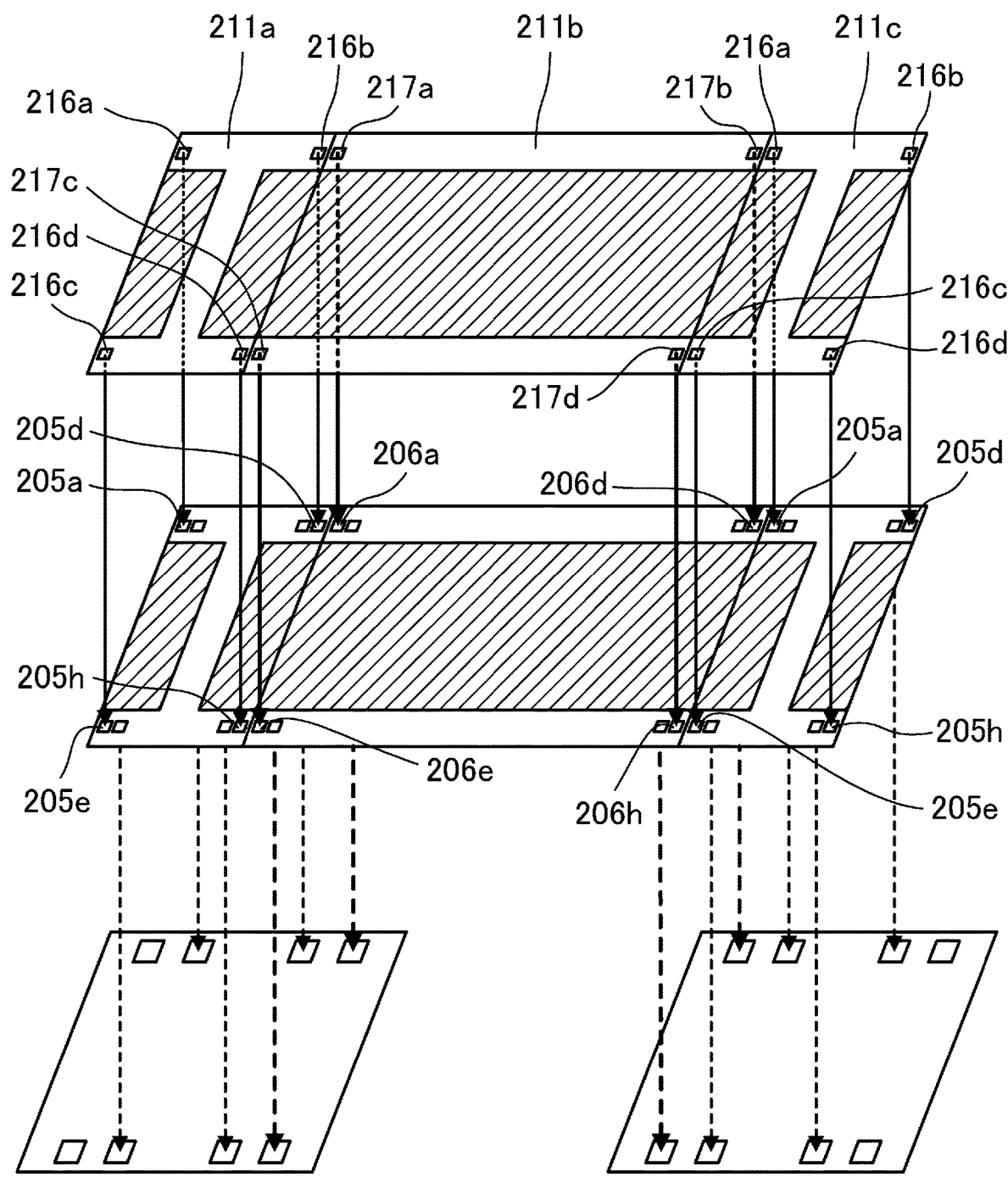
FIG. 15 is a perspective view schematically illustrating the position of the pattern of the gate electrode layer relative to the pattern of the isolation layer in the second embodiment of the present disclosure.

To form the gate electrode layer, after a resist is applied to the semiconductor substrate including a polysilicon layer, and then the semiconductor substrate is exposed using the element forming masks 212 and 213. This is illustrated in FIG. 15. The positions of the mask and the semiconductor substrate are adjusted so that the overlay inspection marks 216a, 216b, 216c, and 216d of the gate electrode forming mask 212 overlap with the respective overlay inspection marks 205a, 205d, 205e, and 205h of the element region 218a formed using the element forming mask 201 in the preceding process, and in this state, exposure is performed. Consequently, a pattern of the element region 211a is formed. Then, the positions of the mask and the semiconductor substrate are adjusted so that the overlay inspection marks 217a, 217b, 217c, and 217d of the gate electrode forming mask 213 overlap with the respective overlay inspection marks 206a, 206d, 206e, and 206h of the element region 211b formed using the second element forming mask 202, and in this state, exposure is performed. Consequently, a pattern of the element region 211b is formed.

After the exposure described above is performed, and the development is completed, whether or not the substrate and the mask are accurately overlaid one on the other is examined by using the overlay inspection marks included in the obtained pattern.

The gate electrode is formed by etching the polysilicon layer using the obtained pattern, and removing the resist. In this manner, the semiconductor device 101 including the isolation layer and the gate electrode layer is manufactured. As in the first embodiment, the method is also applicable to the other layers, for example.

The semiconductor device 101 manufactured in this manner can also obtain the same effect as described in the first embodiment. Moreover, compared to the first embodiment, the semiconductor device 101 of the present embodiment can reduce the number of inspection mark regions to be formed.

In the first and second embodiments described above, the two large and small masks are used to alternately form the patterns. However, this is merely an example of the present disclosure. For example, a plurality of large patterns (each corresponding to the pattern 107b in FIG. 3) may be arranged between small patterns located at the ends (each corresponding to the patterns 107a and 107c in FIG. 3). This is advantageous, for example, when an extremely large imaging region is to be formed.

Moreover, in the example illustrated, the two patterns 107a and 107c at the ends are associated with a single mask (such as the mask 108 in FIG. 4), and the central pattern 107b is sandwiched between these two patterns 107a and 107c, thereby forming a pattern corresponding to a single semiconductor device and including half of each of the patterns at the ends and the central pattern. However, this is merely an example of the present disclosure. More simply, for example, a single semiconductor device may be divided into two large and small patterns, and the single semiconductor device may be formed using the two patterns.

In addition to the imaging device, a linear image sensor, a liquid crystal display, and other similar devices also include a stitch positioned so as to be prevented from overlapping with the imaging section, the display unit, and other similar sections or positioned at a visually inconspicuous portion of the imaging section, while high accuracy in the stitching exposure is maintained. Moreover, in a large capacity memory device, a large-scale logistic device, and other similar devices, since flexibility high enough to allow a stitch to be optionally positioned is given to a designer, it is possible to reduce the chip area.

In each of the figures, squares are used to illustrate various regions such as the element region and the exposure region. This square shape is conceptually right, but in many cases, the various regions each form a shape that is not a correct square (a substantially square shape), due to the presence of small irregularities and other factors.

The present disclosure is useful for a semiconductor device and a method for manufacturing the same, because, in the semiconductor device the pattern of the element of which is larger than the exposable region of the exposure machine, flexibility in the position of a stitch increases while high accuracy in stitching exposure is maintained.

What is claimed is:
1. A semiconductor device, comprising:
   a first inspection mark region and a second inspection mark region having a same pattern including a plurality of overlay inspection marks;
   a first element region having a portion overlapping with the first inspection mark region; and
   a second element region having a portion overlapping with the second inspection mark region, wherein
   the first element region and the second element region are adjacent to each other and have different areas,
   the first element region includes a first pattern aligned with a plurality of first overlay inspection marks that are some of the overlay inspection marks, and
   the second element region includes a second pattern aligned with a plurality of second overlay inspection marks that are some of the overlay inspection marks.

2. The semiconductor device of claim 1, wherein
the first inspection mark region and the second inspection mark region are adjacent to each other,
the first overlay inspection marks are all disposed in the first inspection mark region, and
the second overlay inspection marks are all disposed in the second inspection mark region.

3. The semiconductor device of claim 2, wherein
a total area of the first inspection mark region and the second inspection mark region is equal to a total area of the first element region and the second element region.

4. The semiconductor device of claim 2, wherein
four corners of each of the first inspection mark region and the second inspection mark region each include at least two of the overlay inspection marks that are arranged side by side in an adjacent direction in which the first inspection mark region and the second inspection mark region are adjacent to each other; and a distance between centers of the two overlay inspection marks is about half of a difference between a size of the first element region or the second element region and a size of the first inspection mark region in the adjacent direction.

5. The semiconductor device of claim 2, further comprising:
a third inspection mark region having a same pattern as that of the first inspection mark region, and being adjacent to the second inspection mark region on a side of the second inspection mark region remote from the first inspection mark region; and
a third element region having a portion overlapping with the third inspection mark region, and being adjacent to the second element region on a side of the second element region remote from the first element region, wherein
the third element region has a third pattern aligned with the overlay inspection marks disposed in the third inspection mark region.

6. The semiconductor device of claim 1, wherein
the first inspection mark region and the second inspection mark region are spaced apart from each other,
the first overlay inspection marks are all disposed in the first inspection mark region, and
the second overlay inspection marks are disposed on both of the first inspection mark region and the second inspection mark region.

7. The semiconductor device of claim 6, wherein
four corners of each of the first inspection mark region and the second inspection mark region each include at least two of the overlay inspection marks arranged side by side in a direction in which the first inspection mark region and the second inspection mark region are arranged side by side.

8. The semiconductor device of claim 6, further comprising:
a fourth element region having a portion overlapping with the second inspection mark region and being adjacent to the second element region on a side of the second element region remote from the first element region, wherein
the fourth element region includes a fourth pattern aligned with the overlay inspection marks disposed in at least the second inspection mark region.

9. The semiconductor device of claim 1, wherein
the first element region includes a third overlay inspection mark, and the second element region includes a fourth overlay inspection mark, wherein
the semiconductor device further includes:
a fifth element region having a fifth pattern aligned with the third overlay inspection mark and having a portion overlapping with the first element region; and
a sixth element region having a sixth pattern aligned with the fourth overlay inspection mark, and having a portion overlapping with the second element region.

10. A method for manufacturing a semiconductor device, the method comprising:
exposing an inspection mark mask to form a first inspection mark region and a second inspection mark region having a same pattern including a plurality of overlay inspection marks;
exposing a first mask to form a first pattern, thereby forming a first element region having a portion overlapping with the first inspection mark region; and
exposing a second mask to form a second pattern, thereby forming a second element region having a portion overlapping with the second inspection mark region, wherein
the first element region and the second element region are adjacent to each other and have different areas,
in the forming of the first element region, the first mask is aligned with a plurality of first overlay inspection marks that are some of the overlay inspection marks, and
in the forming of the second element region, the second mask is aligned with a plurality of second overlay inspection marks that are some of the overlay inspection marks.

11. The method of claim 10, wherein
the first inspection mark region and the second inspection mark region are adjacent to each other,
the first overlay inspection marks are disposed in the first inspection mark region, and
the second overlay inspection marks are disposed in the second inspection mark region.

12. The method of claim 11, wherein
a total area of the first inspection mark region and the second inspection mark region is equal to a total area of the first element region and the second element region.

13. The method of claim 11, wherein
four corners of each of the first inspection mark region and the second inspection mark region each include at least two of the overlay inspection marks that are arranged side by side in an adjacent direction in which the first inspection mark region and the second inspection mark region are adjacent to each other; and a distance between centers of the two overlay inspection marks is about half of a difference between a size of the first element region or the second element region and a size of the first inspection mark region, in the adjacent direction.

14. The method of claim 11, further comprising:
exposing the inspection mark mask to form a third inspection mark region that is adjacent to the second inspection mark region on a side of the second inspection mark region remote from the first inspection mark region; and
exposing a third mask to form a third element region that has a portion overlapping with the third inspection mark region, wherein
in the forming of the third element region, the third mask is aligned with the overlay inspection marks disposed in the third inspection mark region.

15. The method of claim 10, wherein the first inspection mark region and the second inspection mark region are spaced apart from each other, the first overlay inspection marks are disposed in the first inspection mark region, and the second overlay inspection marks are disposed on both of the first inspection mark region and the second inspection mark region.

16. The method of claim 15, wherein four corners of each of the first inspection mark region and the second inspection mark region each include at least two of the overlay inspection marks, which are arranged side by side in a direction in which the first inspection mark region and the second inspection mark region are arranged side by side.

17. The method of claim 15, further comprising:

exposing a fourth mask to form a fourth pattern, thereby forming a fourth element region having a portion overlapping with the second inspection mark region and being adjacent to the second element region on a side of the second element region remote from the first element region, wherein in the forming of the fourth element region, the fourth mask is aligned with the overlay inspection marks disposed in the second inspection mark region.

18. The method of claim 10, wherein the first pattern formed in the first element region includes a third overlay inspection mark, and the second pattern formed in the second element region includes a fourth overlay inspection mark, the method further includes:

aligning a fifth mask with the third overlay inspection mark and exposing the fifth mask to form a fifth pattern, thereby forming a fifth element region having a portion overlapping with the first element region: and aligning a sixth mask with the fourth overlay inspection mark and exposing the sixth mask to form a sixth pattern, thereby forming a sixth element region having a portion overlapping with the first element region.

* * * * *